(12) United States Patent
Yoshioka et al.

(10) Patent No.: US 6,610,418 B1
(45) Date of Patent: Aug. 26, 2003

(54) ELECTOLYTIC COPPER FOIL WITH CARRIER FOIL AND METHOD FOR MANUFACTURING THE SAME

(75) Inventors: Junshi Yoshioka, Ageo (JP); Akiko Sugimoto, Ageo (JP); Makoto Dobashi, Ageo (JP); Ken-ichiro Iwakiri, Ageo (JP); Yutaka Hirasawa, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 59 days.

(21) Appl. No.: 10/031,279

(22) PCT Filed: Sep. 29, 2000

(86) PCT No.: PCT/JP00/06764

§ 371 (c)(1),
(2), (4) Date: Nov. 7, 2001

(87) PCT Pub. No.: WO01/34880

PCT Pub. Date: May 17, 2001

(30) Foreign Application Priority Data

Nov. 11, 1999 (JP) ............................................. 11-321606

(51) Int. Cl.$^7$ ............................ B32B 15/08; C25D 1/22; C25D 7/06; C25D 9/02; H05K 1/09
(52) U.S. Cl. ..................... 428/607; 428/612; 428/626; 428/327; 428/457; 428/935; 205/76; 205/109; 205/182; 205/317
(58) Field of Search ........................... 205/109, 76, 77, 205/111, 182, 317; 428/624, 626, 612, 935, 202, 41.8, 327, 457, 607

(56) References Cited

U.S. PATENT DOCUMENTS

| | | | | |
|---|---|---|---|---|
| 4,915,797 A | * | 4/1990 | Vigezzi et al. | 205/138 |
| 6,240,636 B1 | * | 6/2001 | Asai et al. | 29/852 |
| 6,270,889 B1 | * | 8/2001 | Kataoka et al. | 428/352 |
| 6,319,620 B1 | * | 11/2001 | Kataoka et al. | 428/626 |
| 2001/0019780 A1 | * | 9/2001 | Obata et al. | 428/607 |
| 2002/0090497 A1 | * | 7/2002 | Kataoka et al. | 428/209 |

FOREIGN PATENT DOCUMENTS

| | | | |
|---|---|---|---|
| EP | 0 930 811 A1 | * | 7/1999 |
| EP | 0 996 318 A2 | * | 10/1999 |
| JP | 61-188474 | * | 8/1986 |

* cited by examiner

*Primary Examiner*—John J. Zimmerman
(74) *Attorney, Agent, or Firm*—Jenkens & Gilchrist

(57) ABSTRACT

The present invention provides electrodeposited copper foil with carrier which has an organic adhesive interface layer permitting control of the lower limit of peel strength between a carrier foil and an electrodeposited copper foil and to a method for producing the electrodeposited copper foil with carrier. In the electrodeposited copper foil with carrier including a carrier foil, an adhesive interface layer formed on the carrier foil, and an electrodeposited copper foil formed on the adhesive interface layer, the carrier foil is formed of a copper foil and the adhesive interface layer contains an organic agent and metallic particles, the organic agent and the metallic particles being in an intermingled state.

7 Claims, 3 Drawing Sheets

ELECTOLYTIC COPPER FOIL WITH CARRIER FOIL AND METHOD FOR MANUFACTURING THE SAME

TECHNICAL FIELD

The present invention relates to electrodeposited copper foil with carrier predominantly employed for producing printed wiring boards, and to a method for producing the electrodeposited copper foil.

BACKGROUND ART

Conventionally, electrodeposited copper foil with carrier has been employed as a material for producing printed wiring boards, which are widely used in the electric and electronic industries. In general, electrodeposited copper foil with carrier is bonded, through hot-pressing, onto an electrically insulating polymer material substrate such as glass-epoxy substrate, phenolic polymer substrate, or polyimide, to thereby form a copper-clad laminate, and the thus-prepared laminate is used for producing printed wiring boards of high density mounting.

In hot-pressing, a copper foil, a prepreg (substrate) which is cured into a B-stage, and mirror plates serving as spacers are laid-up in a multilayered manner, and the copper foil and the prepreg are hot-press-bonded at high temperature and pressure (hereinafter the step may be referred to as "press-forming"). When wrinkles are in turn generated in the copper foil to be pressed, cracks are generated in the wrinkled portions, thereby possibly causing bleeding of resin from a prepreg, or open circuit of a formed electric circuit during an etching step followed in production steps of printed wiring boards. In an electrodeposited copper foil with carrier, the carrier foil prevents generation of wrinkles in the electrodeposited copper foil.

Electrodeposited copper foils with carrier are generally divided into two types; i.e., foils with peelable carriers and foils with etchable carriers. Briefly, the difference between the two types of foils lies in the method for removing the carrier after completion of press-forming. In foil with peelable carrier, the carrier is removed by peeling, whereas in foil with etchable carrier, the carrier is removed by etching. The present invention is directed to electrodeposited copper foil with peelable carrier.

However, the peel strength of conventional foils with peelable carrier after completion of press-forming varies considerably, and a preferable strength of 50–300 gf/cm is commonly required. In some cases, a carrier foil cannot be removed from the copper foil. Thus, conventional foils with peelable carrier have a drawback; i.e., target peel strength is difficult to attain. The drawback prevents the widespread use of the electrodeposited copper foil with carrier employed for general use.

Causes of deviation in peel strength of a carrier foil will next be described. Conventional electrodeposited copper foil with carrier, regardless of whether the carrier is peelable or etchable, has a metallic—e.g., zinc-containing—adhesive interface layer between the carrier foil and the electrodeposited copper foil. The amount of metal components forming the adhesive interface layer determines, with slight dependence on the type of the carrier foil, whether the formed copper foil with carrier has peelable carrier or etchable carrier.

In many cases, such a metallic adhesive interface layer is formed electrochemically; i.e., through electrodeposition by use of a solution containing a predetermined metallic element. However, in electrodeposition, controlling the amount of deposition on a very minute scale is difficult, and reproduction of the deposition is unsatisfactory as compared with other methods for forming the adhesive interface layer. In addition, the boundary line of the required deposition amount determining whether the formed carrier becomes peelable or etchable is difficult to adjust; i.e., small variations in amount of a metallic component contained in the adhesive interface layer determine the type of the carrier. Thus, stable peeling performance may be difficult to attain.

From another point of view, such a carrier foil is removed by peeling after completion of press-forming typically carried out at a temperature as high as 180° C. under high pressure and 1 to 3 hours. Components contained in the carrier foil and copper atoms contained in the electrodeposited copper foil may be mutually diffused through the adhesive interface layer. Such mutual diffusion strengthens the adhesion, thereby failing to attain preferred peel strength.

In order to solve the aforementioned drawbacks, the present inventors have proposed electrodeposited copper foil with carrier in which the adhesive interface layer between the carrier foil layer and the electrodeposited copper foil comprises an organic agent such as CBTA, and a method for producing the electrodeposited copper foil.

The aforementioned electrodeposited copper foil with carrier which the present inventors have proposed completely solves a drawback that the carrier foil cannot be peeled. However, in some cases, the electrodeposited copper foil has another drawback in handling thereof due to excessively easy peeleability; i.e., the carrier foil and the electrodeposited copper foil are separated from each other by peeling during handling of the electrodeposited copper foil with carrier.

Principally, an advantage of electrodeposited copper foil with carrier per se is the state where one surface of the carrier foil were as if bonded in a lamination manner to one surface of an electrodeposited copper layer. In other words, the electrodeposited copper foil with carrier can prevent staining the surface of the electrodeposited copper foil with foreign matter and damaging the electrodeposited copper foil layer by maintaining the bonding state at least immediately before an etching step for forming printed circuits, which step is carried out after production of a copper-clad laminate through hot-pressing the electrodeposited copper foil with carrier and a prepreg (substrate)

Thus, separation of a carrier foil and an electrodeposited copper foil during handling of the electrodeposited copper foil with carrier before hot-press-forming is not acceptable.

SUMMARY OF THE INVENTION

In view of the foregoing, the present inventors have conducted earnest studies, and have attained electrodeposited copper foil with carrier which has an adhesion interface layer comprising an organic agent such that the lower limit of peel strength between the carrier foil and the electrodeposited copper foil is controllable, and a method for producing the electrodeposited copper foil with carrier.

There is provided an electodeposited copper foil with carrier comprising a carrier foil, an adhesive interface layer formed on the carrier foil, and an electrodeposited copper foil layer formed on the adhesive interface layer, wherein the carrier foil is formed of a copper foil and the adhesive interface layer contains an organic agent and metallic particles, the organic agent and the metallic particles being intermingled.

Conventional electrodeposited copper foils with peelable carrier, in some cases, have a problem that a carrier foil cannot be readily peeled from an electrodeposited copper foil. The present inventors have resolved the problem by forming an adhesive interface layer comprising an organic agent on the carrier foil and forming an electrodeposited copper foil on the adhesive interface layer. Thus, unevenness in peel strength at the adhesive interface between the carrier foil and the electrodeposited copper foil has been considerably reduced. In most cases, the adhesive interface layer is formed by immersing a carrier foil in an organic agent, and an inorganic metallic component has not intentionally been incorporated into the adhesive interface layer.

However, when an organic adhesive interface layer is formed through immersion and a copper foil layer is formed on the adhesive interface layer through electrodeposition, a trace amount of the copper component may migrate into an organic agent contained in the adhesive interface layer. Although copper can be detected in the adhesive interface layer of actually produced copper foils with carrier through EPMA analysis, the amount is considerably small and copper cannot be identified as microparticles. In addition, the detected copper component may be incorporated as contamination during preparation of analysis samples.

The present inventors have conducted further studies on the electrodeposited copper foil with carrier, and have found that incorporation of metallic particles into an organic adhesive interface layer; i.e., a state in which the metallic particles and the organic agent are intermingled, results in stable and even peel strength at the adhesive interface.

In the aforementioned mode, the metallic component which has intermingled with the organic agent is copper contained in the copper foil. Thus, when the adhesive interface layer containing copper particles and a carrier foil made of copper are employed, the metallic element is singly copper, thereby facilitating recycling of carrier foil.

No particular limitation is imposed on the carrier foil employed in the present invention so long as the foil is made of copper, and any method for producing the copper foil such as electrolysis or rolling may be employed. The electrodeposited copper foil layer is formed on the adhesive interface layer which is in advance formed on the carrier foil by immersing the carrier foil in a solution; e.g., a copper sulfate solution, allowing electrodeposition of copper and polarizing the carrier foil itself. Thus, a copper foil which permits passing of electricity and has excellent electrical conductivity is preferably employed as a carrier foil. Throughout the description, the carrier foil is referred to as "copper carrier foil."

In the present invention, at least one species selected from nitrogen-containing organic compounds, sulfur-containing organic compounds, and carboxylic acids is preferably employed as the organic agent. The specific organic agents described below are suitably used in the present invention. At present, it is confirmed that these compounds are not detrimental to production of printed wiring boards from produced copper-clad laminates including steps such as resist-application steps, etching steps, plating steps, and mounting steps.

Among these compounds, the nitrogen-containing organic compounds may have a substituent. Specifically, substituted triazloes are preferably used. Examples include 1,2,3-benzotriazole (hereinafter referred to as BTA), carboxybenzotriazole (hereinafter referred to as CBTA), N', N'-bis(benzotriazolylmethyl) urea (hereinafter referred to as BTD-U), 1H-1,2,4-triazole (hereinafter referred to as TA), and 3-amino-1H-1,2,4-triazole (hereinafter referred to as ATA).

Examples of preferably employed sulfur-containing compounds include mercaptobenzothiazole (hereinafter referred to as MBT), thiocyanuric acid (hereinafter referred to as TCA), and 2-benzimidazolethiol (hereinafter referred to as BIT).

Monocarboxylic acids are particularly preferably used as the carboxylic acids. Examples include oleic acid, linoleic acid, and linolenic acid.

FIG. 1 shows an adhesive interface layer in which metallic microparticles and an organic agent are intermingled. The adhesive interface layer is observed under a transmission electron microscope (TEM). In FIG. 1, the adhesive interface layer has a thickness of 0.1–0.5 μm, and the ratio of the amount of the metallic component to that of the organic agent in the adhesive interface layer (represented by [cross-sectional area of the metallic component]/[cross-sectional area of the organic agent]) is 18.2. The ratio is an area ratio which is obtained by measuring the overall cross-sectional area of the metallic component and that of the organic agent in the TEM image.

In the present description, the term "appropriate peel strength" refers to a peel strength, as measured on the basis of JIS C-6481, of 1–300 gf/cm. The range is calculated in consideration of electrodeposited copper foils with peelable carrier which have conventionally been used. Specifically, the range has been obtained in view of peel strength which has empirically been considered to be appropriate, and ideal peel strength which users desire to attain.

The lower the peel strength at an interface between a carrier foil and an electrodeposited copper foil, the easier the peeling of the carrier foil from the copper foil. However, when the peel strength is less than 1 gf/cm, a carrier foil is spontaneously peeled partially from an electrodeposited copper foil during transport of a roll in the production process of the copper foil with carrier or during production of copper-clad laminates, thereby causing generation of failures such as blisters and slippage. When the peel strength exceeds 300 gf/cm, a carrier foil is difficult to peel off, and peeling the carrier foil off requires a particular peeling apparatus. This situation differs from that made possible by the features of the present invention.

Throughout the description, the term "electrodeposited copper foil (electrodeposited copper foil layer)" refers to an electrodeposited copper foil attached with copper microparticles for anchoring and an anti-corrosion layer as shown in the cross-sectional view of FIG. 2. The copper microparticles form a surface-treated layer which ensures stable adhesion between a bulk copper layer for maintaining electrical conductivity and an insulating substrate. However, in the present description, detailed description of the surface-treated layer is omitted in the parts other than "Modes for Carrying Out the Invention."

The present inventors have further found a very useful method for producing the aforementioned electrodeposited copper foil with carrier. Specifically, the method comprises forming an adhesive interface layer containing an organic agent on a copper carrier foil through electrodeposition and, subsequently, electrodepositing a copper component serving as an electrodeposited copper foil layer. An electrodeposited copper foil with carrier can be obtained through this method.

Accordingly, there is provided a method for producing an electrodeposited copper foil with carrier, which method comprises electrodepositing and organic agent on a surface of a copper carrier foil to thereby form and adhesive interface layer, and electrodepositing copper on the adhesive interface layer to thereby form an electrodeposited copper layer.

When the adhesive interface layer is formed on the carrier foil through electrodeposition of an organic agent, conditions such as pre-treatment for cleaning the copper carrier foil, current density, and electrolysis time are important. The pre-treatment for cleaning the copper carrier foil is pickling by use of a solution of acid such as sulfuric acid, and is performed so as to remove contaminants adhered on the surface and remove unnecessary oxide film.

The organic agent is electrodeposited preferably at a current density of 1–100 mA/dm$^2$. When the current density is less than 1 mA/dm$^2$, deposition rate is excessively low and is not suited for commercial production, whereas when the current density exceeds 100 mA/dm$^2$, unevenness in electrodeposition of the organic agent occurs more frequently.

The electrolysis time is determined in consideration of the aforementioned appropriate thickness of the adhesive interface layer and the aforementioned current density, and is typically 2–5 hours. When the electrolysis time is less than two hours at a current density falling within the aforementioned range, appropriate copper microparticles are not formed in the organic adhesion interface layer. In contrast, when the time is longer than five hours, the thickness of the organic adhesive interface layer increases, thereby lowering electrical conductivity.

When an organic agent is electrodeposited on the aforementioned copper carrier foil, the copper carrier foil must be anodically polarized in a solution containing the organic agent, in a manner different from that employed for depositing metallic elements. The electrodeposition allows deposition of the organic agent uniformly at an appropriately great thickness as compared with simple immersion.

Employment of the method results in an adhesive interface layer in which an organic material and metallic particles are intermingled. However, the mechanism of generating the intermingled state has not yet been elucidated. The present inventors assume the following mechanism. Specifically, anodically polarized copper carrier foil per se is dissolved during electrolysis. Released copper ions form a complex with an organic material remaining in the vicinity of the anode, to thereby form an organic adhesive interface layer comprising a metallic component on the copper carrier foil. When further electrodeposition; e.g., electrodeposition of copper or electrodeposition of a corrosion-inhibiting element, is carried out, a specific amount of the further electrodeposited metallic element penetrates the adhesive interface layer.

The organic agent preferably has a concentration of 1–10 g/l. When the concentration is less than 1 g/l, deposition rate is excessively low and is not suitable for commercial production, whereas when the concentration is in excess of 10 g/l, the deposition rate does not increase commensurate with an increase in concentration.

The temperature of a solution containing the organic agent is 20–60° C. The temperature range is determined in consideration of such conditions that the aforementioned organic agent does not readily dissolve, thereby providing full reactivity of the agent. Thus, when the temperature is less than 20° C., reactivity between the copper carrier foil and the organic agent is poor and stable deposition rate is not attained, whereas when the temperature is in excess of 60° C., decomposition of the organic agent is excessively high, thereby causing poor solution stability.

The pH of the organic agent-containing solution is preferably 3–8. When the pH is lower than 3 (strongly acidic conditions) or greater than 8 (alkaline conditions), the organic agent decomposes, thereby providing poor solution stability and failing to provide uniform electrodeposition. When the pH is 3–8, treatment of waste solution can readily be carried out.

Electrical resistance of the solution becomes high due to selection of the organic agents. In such a case, electrolytes such as sulfuric acid, hydrochloric acid, and sodium hydroxide may be fed to the solution, to thereby adjust the electrical resistance. These electrolytes provide no adverse effect on properties of the solution containing the organic agent.

Conditions of copper electrodeposition for forming an electrodeposited copper foil layer on the adhesion interface layer will next be described. In a bulk electrolysis bath, no particular limitation is imposed on the source solution of copper ions, and copper sulfate solution, copper pyrophosphate, and similar solutions may be employed. For example, electrodeposition may be carried out in a copper sulfate solution containing copper (30–100 g/l) and sulfuric acid (50–200 g/l) at a solution temperature of 30–80° C. and a current density of 1–100 A/dm$^2$, or in a copper pyrophosphate solution containing copper (10–50 g/l) and potassium pyrophosphate (100–700 g/l) at a solution temperature of 30–60° C., a pH of 8–12, and a current density of 1–10 A/dm$^2$.

In practice, an adhesive interface layer-formed copper carrier foil is immersed in a copper-source solution. The carrier foil per se is cathodically polarized, while anodes are placed so as to face an adhesive surface of the carrier foil in parallel. Thus, copper species for forming a bulk copper layer are homogeneously and smoothly deposited on the adhesive interface layer.

The thus-produced electrodeposited copper foil with carrier according to the present invention has an adhesive interface layer having a thickness of 1 nm to 1.2 μm. The ratio of the amount of the metallic component to that of the organic agent in the adhesive interface layer (represented by [cross-sectional area of the metallic component]/[cross-sectional area of the organic agent]), which is obtained from an TEM image by calculating in the aforementioned manner, is 1–20. When the ratio falls within the range, peel strength is appropriate. The present invention will next be described more in detail by way of modes for carrying out the invention.

MODES FOR CARRYING OUT THE INVENTION

Figure 1:
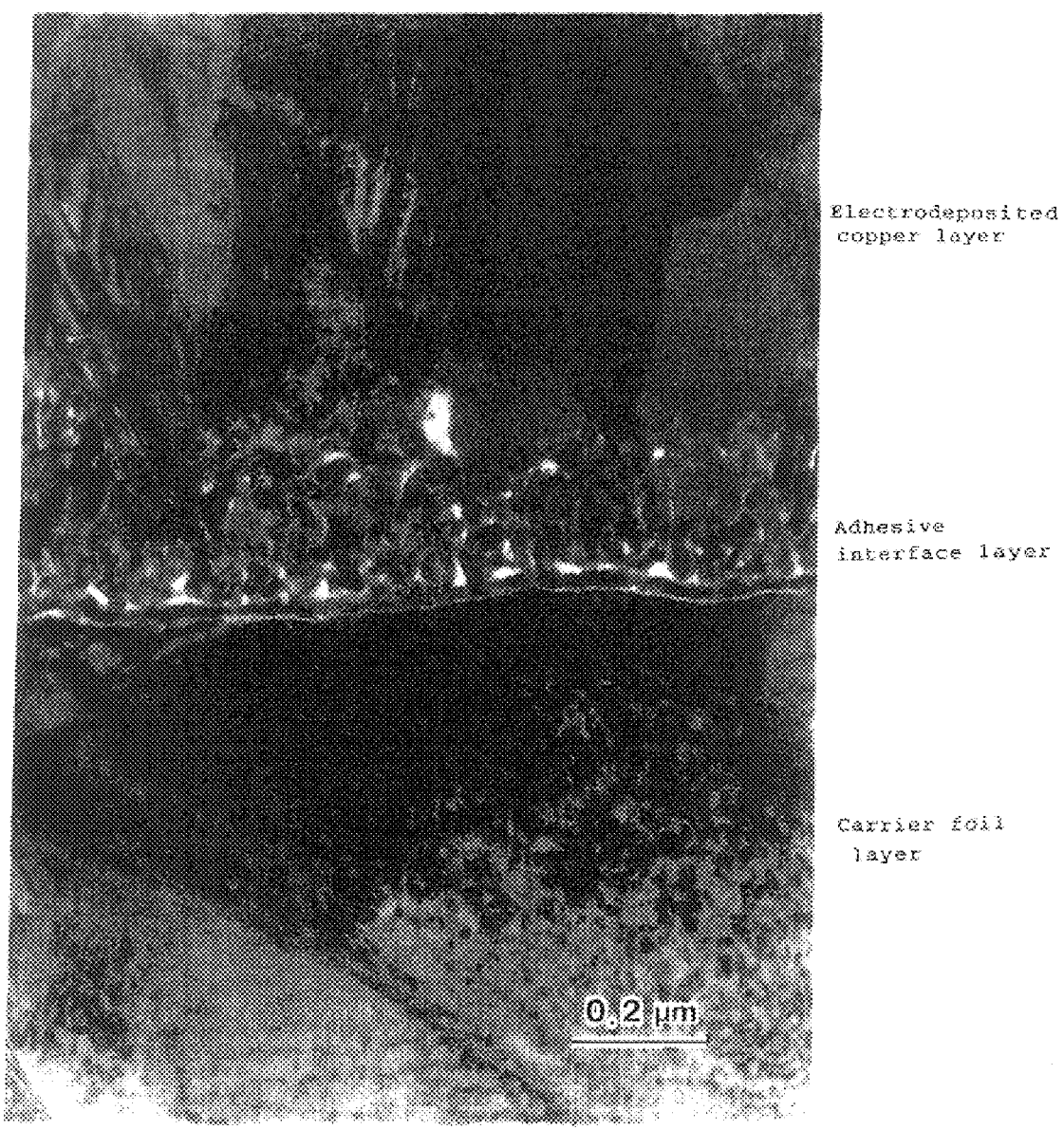
FIG. 1 is a cross-sectional view showing an adhesive interface layer in which metallic microparticles and an organic agent are intermingled.
Figure 2:
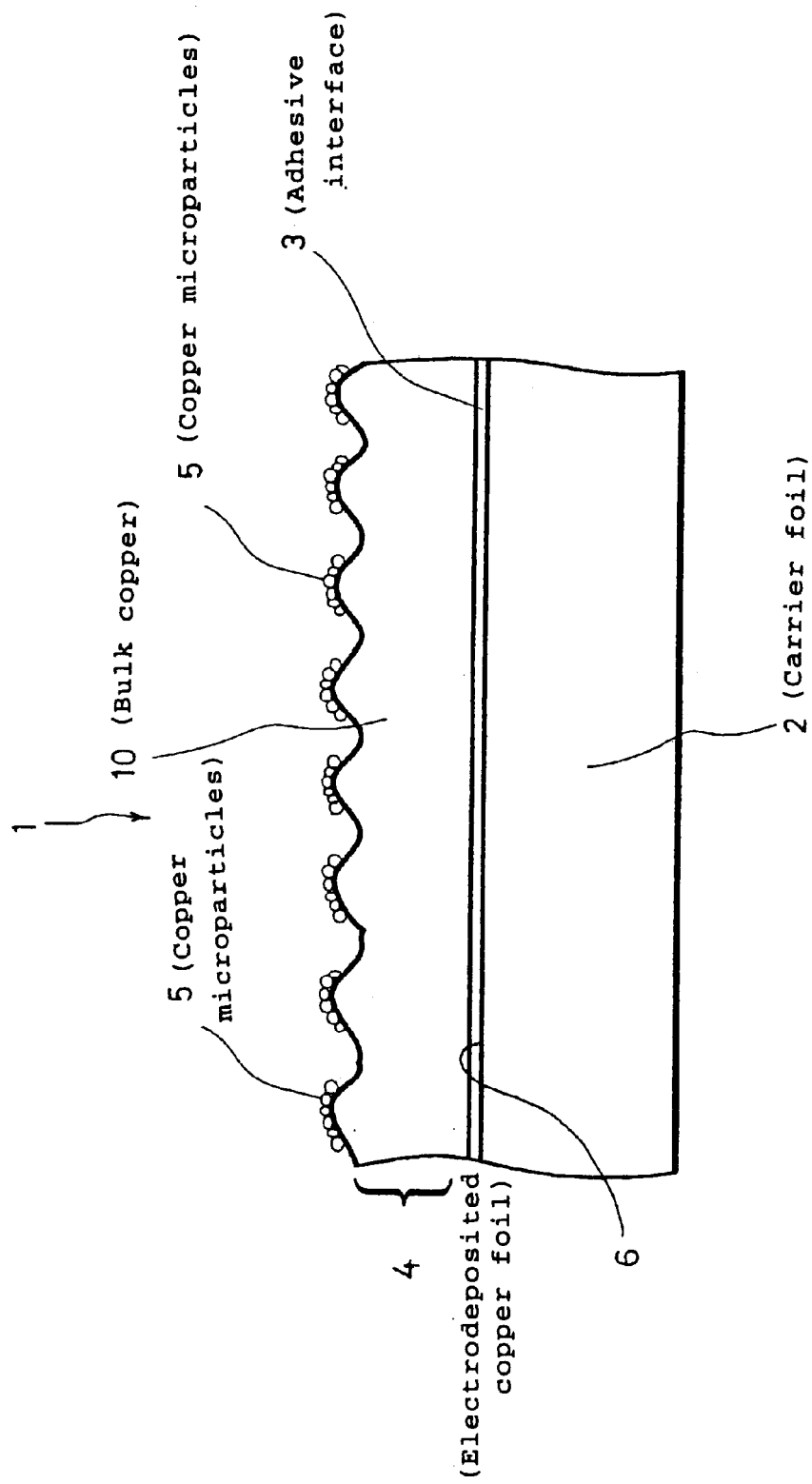
FIG. 2 is a schematic cross-sectional view of an copper foil.

Embodiments for carrying out the present invention will next be described; i.e., an electrodeposited copper foil with carrier 1 and a method for producing the same will be described in detail. Description with reference to FIGS. 2 and 3 will be focused on the case in which a carrier foil 2 is employed as an electrodeposited copper foil.

Figure 3:
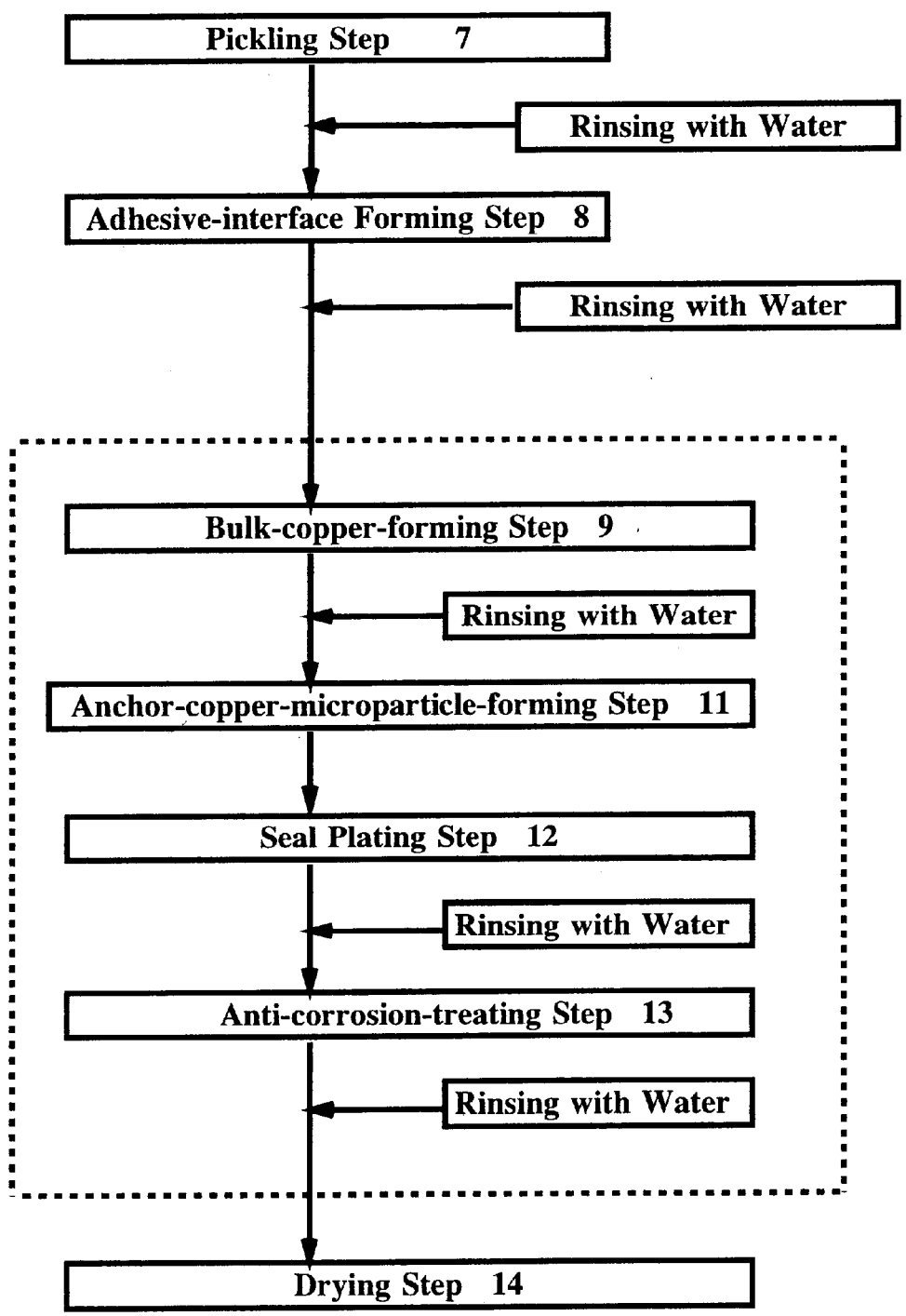
FIG. 3 shows a schematic flow chart of production of the electrodeposited copper foil with carrier according to the present invention.

The production process employed in the present embodiment is described with reference to the schematic flow chart of production of the electrodeposited copper foil with carrier in FIG. 3. On the carrier foil 2, an adhesion interface (layer)

3 and an electrodeposited copper foil (layer) 4 were sequentially formed. A carrier foil having a thickness of 18 μm and classified as grade 3 was employed as the carrier foil 2. The foil is not subjected to formation of anchor microcopper particles 5 and anti-corrosion treatment. The electrodeposited copper foil layer 4 having a thickness of 5 μm was formed on a shiny side 6 of the carrier foil. Hereinafter, production conditions of electrodeposited copper foils with carrier will be described in accordance with the order of the steps.

Firstly, conditions in pickling step 7 are described. The carrier foil 2 was pickled prior to formation of the adhesive interface 3. The carrier foil 2 was transferred into a pickling bath filled with a diluted sulfuric acid solution having a concentration of 150 g/l, at 30° C. The carrier foil 2 was immersed for 30 seconds, to remove oily matter and surface oxide film from the surface of the carrier foil 2.

After pickling of the carrier foil 2 had been completed, the foil 2 was rinsed with water, and then subjected to an adhesive-interface-forming step 8. In step 8, the carrier foil 2 was immersed in a 5 g/l aqueous solution (pH 7.5) of BTA at 40° C. The carrier foil 2 was anodically polarized, and electrodeposition was carried out at a current density of 100 mA/dm$^2$ for five hours, thereby forming on a surface of the carrier foil 2 an adhesive interface layer 3. The thus-treated carrier foil was rinsed with water.

Subsequently, in a bulk-copper-forming step 9, a bulk copper layer 10 was electrodeposited on the adhesive interface layer 3. A bulk-copper-forming bath was filled with a copper sulfate solution having a sulfuric acid concentration of 150 g/l and a copper concentration of 65 g/l and maintained at 45° C. The carrier foil 2 having an adhesive interface layer 3 was immersed in the solution and the foil per se was cathodically polarized so as to uniformly and smoothly electrodeposit a copper component on the adhesive interface layer, thereby forming the bulk copper layer 10 serving as the electrodeposited copper foil layer 4. In this case, anode plates were placed such that the anode plates faced one surface of the carrier foil 2 in parallel. Electrolysis was carried out for 60 seconds under uniform plating conditions and at a current density of 15 A/dm$^2$.

After formation of the bulk copper layer 10 was completed, the carrier foil 2 was transferred into an anchor-copper-microparticle-forming step 11 in order to form anchor copper microparticles 5 providing the electrodeposited copper foil layer 6 on the surface of the bulk copper layer 10. This treatment involves electrodepositing anchor copper microparticles 5 on the bulk copper layer 10. The anchor copper microparticles 5 are included into a substrate during production of a copper-clad laminate, to thereby prevent ready release of the copper foil layer from the substrate.

In the step for depositing anchor copper microparticles 5 on the bulk copper layer 10, a copper sulfate solution (sulfuric acid concentration of 100 g/l, copper concentration of 18 g/l, temperature 25° C.) was employed, and electrolysis was carried out for 10 seconds under conditions for forming burnt deposit at a current density of 10 A/dm$^2$. In this case, the carrier foil 2 per se was cathodically polarized, and anode plates were placed such that the anodes plates faced the bulk-copper-layer-deposited surface of the carrier foil 2 in parallel.

In a step for seal plating so as to prevent release of anchor copper microparticles 5 from the bulk copper layer 10, a copper sulfate solution similar to that employed in the aforementioned bulk-copper-forming step 9 (sulfuric acid concentration of 150 g/l, copper concentration of 65 g/l, temperature 45° C.) was employed, and electrolysis was carried out for 10 seconds under smooth plating conditions at a current density of 15 A/dm$^2$. In this case, the carrier foil 2 per se was cathodically polarized, and anode plates were placed such that the anodes plates faced the anchor-copper-microparticles (5)—deposited surface of the carrier foil 2 in parallel.

Anti-corrosion treatment was carried out in an anti-corrosion-treatment step 13, by use of zinc as a corrosion-inhibiting element. In this step, the carrier foil 2 per se was cathodically polarized, and a zinc plate serving as a soluble anode was employed, to thereby maintain the concentration of zinc in the anti-corrosion-treatment bath. The electrolysis was carried out in a zinc sulfate solution comprising sulfuric acid (70 g/l) and zinc (20 g/l), at a temperature of 40° C. for 20 seconds and a current density of 15 A/dm$^2$.

After completion of the anti-corrosion treatment, in a drying step 14, the carrier foil 2 was allowed to stand, over 40 seconds, in a furnace where the atmosphere had been heated to 110° C., to thereby produce an electrodeposited copper foil with carrier 1; i.e., a target product. During the aforementioned steps, the carrier foil was rinsed with water for about 15 seconds at points shown in FIG. 3, thereby preventing the solution from being carried over from the previous bath.

In the thus-formed electrodeposited copper foil with carrier 1, the adhesive interface layer 3 has an average thickness of 23 nm, and the ratio of the amount of the metallic component to that of the organic agent in the adhesive interface layer (represented by [cross-sectional area of the metallic component]/[cross-sectional area of the organic agent]) is 18.2. The electrodeposited copper foil with carrier 1 and two sheets of FR-4 prepreg having a thickness of 150 μm were laminated to thereby produce a double-sided copper-clad laminate. The peel strength at the organic adhesive interface 3 between the carrier foil layer 2 and the electrodeposited copper foil layer 4 was measured. The peel strength of the electrodeposited copper foil with carrier 1 was 14 gf/cm before heating, and 16 gf/cm after heating at 180° C. for one hour.

Furthermore, the present inventors repeated the experiment, except that palmitic acid, stearic acid, oleic acid, linoleic acid, linolenic acid, or mercaptobenzoic acid was used as the aforementioned organic agent instead of BTA which had been employed in the aforementioned embodiment. The results of measuring peel strength on the interface 3 between the carrier foil layer 2 and the electrodeposited copper foil layer 6, before and after heating, are summarized in Table 1. By use of the electrodeposited copper foils with carrier produced in the embodiments, printed wiring boards having a fine circuit portion; i.e., a circuit width of 25 μm and a gap of 25 μm, were produced. The produced printed wiring boards have no problem in appearance and performance.

TABLE 1

| Organic agent forming adhesion interface layer | Peel strength (gf/cm) | |
| --- | --- | --- |
| | before heating | after heating |
| CBTA | 8 | 8 |
| palmitic acid | 28 | 34 |
| stearic acid | 23 | 27 |
| oleic acid | 31 | 35 |

TABLE 1-continued

| Organic agent forming adhesion interface layer | Peel strength (gf/cm) | |
|---|---|---|
| | before heating | after heating |
| linoleic acid | 26 | 33 |
| linolenic acid | 30 | 38 |
| mercaptobenzoic acid | 24 | 30 |
| BTD-U | 11 | 18 |
| MBT | 13 | 19 |
| TCA | 10 | 12 |
| BIT | 13 | 20 |
| TA | 14 | 22 |
| ATA | 10 | 11 |

EFFECTS OF THE INVENTION

In the electrodeposited copper foil with carrier according to the present invention, peeling a copper foil carrier foil from an electrodeposited copper foil at the adhesive interface can readily be carried out. Thus, the electrodeposited copper foil with carrier of the present invention can solve the problems; i.e., excessively easy peelability and peeling failure, which are observed in conventional electrodeposited copper foil with peelable carrier. In addition, as the present inventors have confirmed, stable peelability of a copper carrier foil at the adhesive interface during peeling can be maintained. Such characteristics, which have never been attained, greatly contribute to enhancing production yield of copper-clad laminates.

What is claimed is:

1. An electrodeposited copper foil with carrier comprising a carrier foil, an adhesive interface layer formed on the carrier foil, and an electrodeposited copper foil formed on the adhesive interface layer, wherein the carrier foil is formed of a copper foil and the adhesive interface layer contains an organic agent and metallic particles, the organic agent and the metallic particles being in an intermingled state.

2. A method for producing an electrodeposited copper foil with carrier, which method comprises electrodepositing an organic agent on a surface of a copper carrier foil to thereby form an adhesive interface layer, and electrodepositing copper on the adhesive interface layer to thereby form an electrodeposited copper foil layer.

3. A method of claim 2, wherein said organic agent is electrodeposited while said carrier foil is anodically polarized.

4. A method of claim 3, wherein said organic agent is electrodeposited from a solution having a concentration of 1–10 g organic agent per liter of solution.

5. A method of claim 3, wherein said organic agent is electrodeposited at a current density of 1–100 mA/dm$^2$.

6. A method of claim 3, wherein said organic agent is electrodeposited at a temperature of 20–60° C. and a pH of 3–8.

7. A method of claim 2, wherein said adhesive interface layer has a thickness of 1 m to 1.2 $\mu$m.

* * * * *